United States Patent [19]

Merrill

[11] Patent Number: 5,397,941
[45] Date of Patent: Mar. 14, 1995

[54] INTERFACE CIRCUITS BETWEEN POWERED DOWN DEVICES AND A BUS

[75] Inventor: Richard B. Merrill, Daly City, Calif.

[73] Assignee: National Semiconductor Corporation, Santa Clara, Calif.

[21] Appl. No.: 110,168

[22] Filed: Aug. 20, 1993

[51] Int. Cl.$^6$ ......................................... H03K 19/0175
[52] U.S. Cl. .................................... 307/475; 307/443; 361/91
[58] Field of Search ............ 307/443, 475, 448, 296.5; 361/90–91

[56] References Cited

U.S. PATENT DOCUMENTS

| | | | |
|---|---|---|---|
| 4,574,273 | 3/1986 | Atsumi | 307/475 |
| 4,616,143 | 10/1986 | Miyamoto | 307/475 |
| 4,926,070 | 5/1990 | Tanaka | 307/475 |
| 5,130,883 | 7/1992 | Edwards | 361/91 |
| 5,319,259 | 6/1994 | Merrill | 307/475 |

OTHER PUBLICATIONS

A Tidal Wave of 3-V ICs Opens Up Many Options, Electronic Design, Aug. 20, 1992 Issue, pp. 39–47, by Dave Bursky.
IBM Technical Disclosure Bulletin. "Overvoltage Protection Circuit," vol. 30, No. 12, May 1988, New York US. pp. 96–97.

*Primary Examiner*—Edward P. Westin
*Assistant Examiner*—Andrew Sanders
*Attorney, Agent, or Firm*—Steven F. Caserza

[57] ABSTRACT

In accordance with the teachings of this invention, a novel interface circuit is incorporated in a lower voltage circuit, allowing that circuit to properly interface with a higher voltage bus even when the lower voltage circuit is powered down. In accordance with the teachings of this invention, a pass transistor is used which connects the lower voltage circuit to the bus during normal operation, and which disconnects the lower voltage circuit from a bus when desired, such as when the lower voltage circuit is powered down. Additional circuit means are provided to ensure that the voltage across the pass transistor does not exceed a safe level, such as by utilizing voltage divider circuitry for dividing the bus voltage so that only a portion of the bus voltage appears across the pass transistor. In one embodiment of this invention, the voltage divider is formed of resistors, diodes, load devices, or combinations thereof.

47 Claims, 3 Drawing Sheets

INTERFACE CIRCUITS BETWEEN POWERED DOWN DEVICES AND A BUS

FIELD OF THE INVENTION

This invention pertains to electronic circuits such as integrated circuits utilizing input and output stages for interfacing with other integrated circuits or electronic devices. More specifically, this invention pertains to electronic circuits which are capable of being powered down while remaining connected to a powered up bus of higher operating or transient voltage, without drawing excessive current or affecting the status of signals on that powered up bus.

BACKGROUND

Integrated circuits have achieved widespread use in that they are capable of reducing the space required to achieve a given electrical function, with an attendant increase in performance including a reduction in power requirements. In order for integrated circuits to conveniently interface with other integrated circuits and other types of electronic circuitry, certain industry-wide input/output (I/O) specifications have been developed. One example is the transistor-transistor logic (TTL) standard in which a supply voltage of 5 volts (nominal) is applied to a device. An input signal associated with a logical zero has a maximum voltage of approximately 0.7 volts and a logical one input level has a minimum voltage of approximately 2 volts. This TTL specification also requires that an integrated circuit provide an output voltage of at least approximately 2.4 volts associated With a logical one output signal, and an output voltage of not more than approximately 0.4 volts associated with a logical zero output level.

Current advancements in integrated circuit technology are spurring an evolution to lower voltage devices than the TTL standard. For example, one current trend is to develop integrated circuits utilizing 3 or 3.3 volt power supplies. In the future, even lower voltage devices (such as 2.4 volt devices) will be developed. Among the reasons for moving to lower voltage integrated circuits are a need to reduce system power without a corresponding tradeoff in performance.

Given the large number of TTL device types, it would be desirable to provide lower voltage devices which are capable of withstanding excessive voltages applied to their input and output pins from external sources, for example, if they are inadvertently or intentionally used with TTL devices or interfaces. Thus, for example, for a 3.0 volt device in which a high output voltage of approximately 3 volts corresponds to a logical one output signal, it would be very beneficial if the device were able to withstand a TTL logical one voltage level of approximately 5 volts applied to the output terminal, without consuming excessive power or incurring damage. Similarly, it would be very beneficial if a 2.4 volt device were able to withstand a logical one level of approximately 5 volts (TTL standard) or approximately 3.0 volts (for a 3.0 volt device) logical one signals apply to the output terminal. U.S. patent application Ser. No. 07/994,783, filed Dec. 22, 1992 discloses certain low voltage input and output circuits with overvoltage protection, allowing such a lower voltage device to operate with higher voltage devices without deleterious effects.

FIG. 1 is a block diagram depicting a first circuit 101 connected to bus 103 via protection circuit 102. In this general form of the present invention, circuit 101 may be a 3 volt integrated circuit device, for example, and bus 103 may be a typical prior art TTL level bus, operating with voltages up to about a nominal 5 volt level. Protection circuit 102, as taught by this invention and more fully described in the following examples, serves to provide an interface between circuit 101 and bus 103 allowing circuit 101 to be powered down without drawing excessive current or deleteriously affecting the signal levels on bus 103.

Certain prior art examples of such circuits 102 are described in Electronic Design, Aug. 20, 1992, page 42. The prior art technique described in that reference article includes the use of a pass transistor connected between the output of the circuit and the bus (or bonding pad which is in turn connected to the bus), with the gate of the pass transistor being connected to the 3 volt VCC level of circuit 101. An alternative prior art circuit described in that reference article utilizes two pass transistors, one connected between the bonding pad and the pull-up transistor, and the other connected between the bonding pad and the pull-down transistor, each having their gates connected to the 3 volt VCC level of circuit 101.

The prior art circuits thus described suffer from a number of disadvantages. First, and foremost, they do not provide adequate protection between a powered down circuit and the bus in that the gate of the pass transistors of such prior art circuits are connected to the VCC of the circuit. When powered down, this VCC is 0 volts, in which event the pass transistor remains turned off and the full voltage of the bus appears across the gate oxide of the pass transistor. As an example, when circuit 101 is a 3 volt circuit, the maximum gate oxide voltage allowable is approximately 4.6 volts if the circuit is optimized for speed and power performance. However, as previously described, the bus may be a TTL level bus, in which its voltage may rise as high as 5 volts (actually, as high as approximately 7 volts considering overshoots which are typically encountered on TTL buses), which is clearly in excess of the maximum gate oxide voltage of the 3 volt process used to fabricate circuit 102 as part of an integrated circuit also including circuit 101.

Other prior art circuits utilize an interface circuit capable of detecting overvoltages but such overvoltage detection circuits operate with a certain amount of delay, meaning that the circuit cannot properly respond to fast transient voltage changes, which allows excessive voltages to appear across the gate oxide of the pass transistor.

Clearly each of these prior art attempts to allow a lower voltage circuit to interface with a higher voltage bus is inadequate to protect the lower voltage circuit from transient voltages, particularly when the lower voltage circuit 101 is powered down while connected to an active bus 103.

SUMMARY OF THE INVENTION

In accordance with the teachings of this invention, a novel interface circuit is incorporated in a lower voltage circuit, allowing that circuit to properly interface with a higher voltage bus even when the lower voltage circuit is powered down. In accordance with the teachings of this invention, a pass transistor is used which connects the lower voltage circuit to the bus during normal operation, and which disconnects the lower voltage circuit from a bus when desired, such as when the lower voltage circuit is powered down. Additional circuit means are provided to ensure that the voltage across the pass transistor does not exceed a safe level, such as by utilizing voltage divider circuitry for dividing the bus voltage so that only a portion of the bus voltage appears across the pass transistor. In one embodiment of this invention, the voltage divider is formed of resistors, diodes, load devices, or combinations thereof.

DETAILED DESCRIPTION

Figure 1:
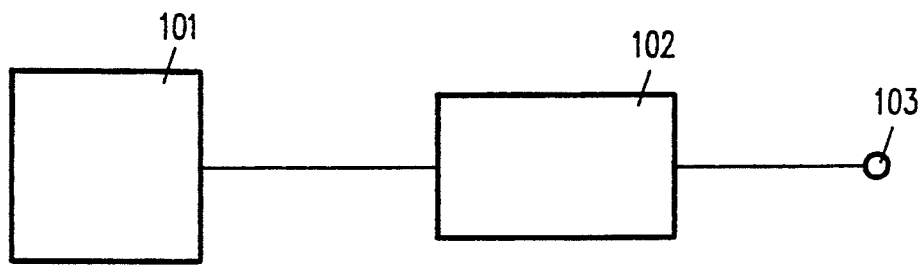
FIG. 1 is a block diagram depicting a typical circuit connected to a bus via a protection circuit.
Figure 2:
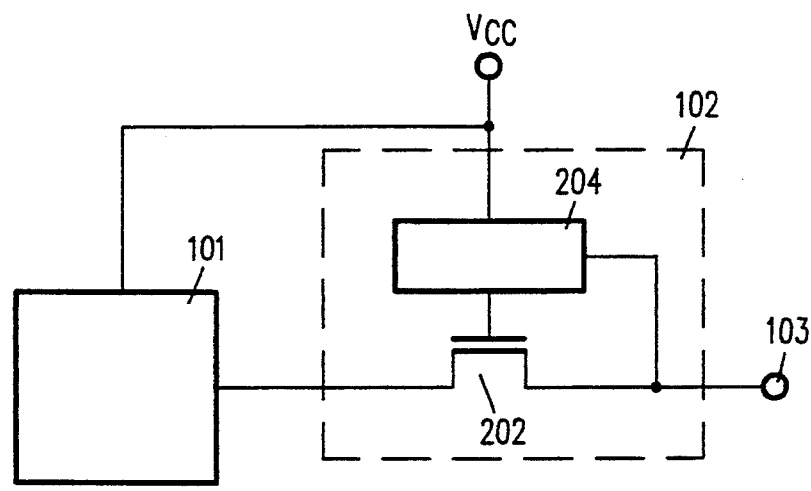
FIG. 2 is a block diagram of a general embodiment of the present invention.

FIG. 2 is a block diagram of a general depiction of the present invention including low voltage circuit 101 connected to higher voltage bus 103 via interface circuitry 102 which includes pass transistor 202 and voltage divider/control circuitry 204. Pass transistor 202 has one source/drain terminal connected to the output lead of circuit 101 and its other source/drain terminal connected to bus 103, and its gate connected to voltage divider/control circuitry 204. Voltage divider/control circuitry 204 is connected to receive the VCC supply of low voltage circuit 101 for application to the gate of pass transistor 202, thereby enabling pass transistor 202 to be turned on when circuit 101 is powered up. Conversely, with circuit 101 powered down, VCC is zero, and pass transistor 202 is turned off. At this time, voltage divider/control circuit 204 serves to divide the voltage present on bus 103 so that the voltage appearing across the gate oxide of pass transistor 202 does not exceed a safe limit.

Figure 3:
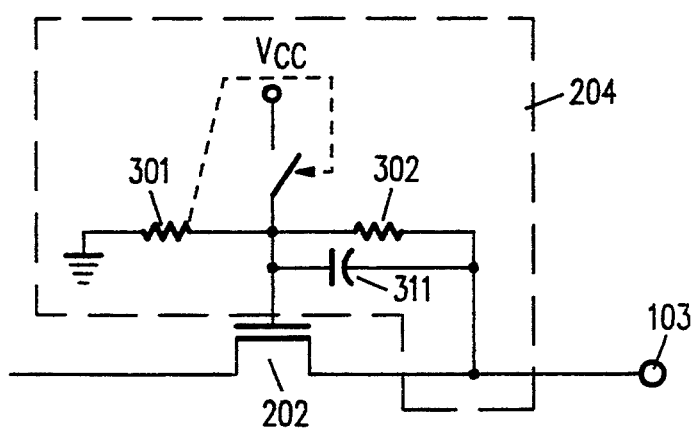
FIG. 3 is a schematic diagram of one embodiment of an interface circuit operating with a pass transistor in accordance with the teachings of this invention.

FIG. 3 is a schematic diagram depicting one embodiment of voltage divider/control circuitry 204 shown interconnected with pass transistor 202. In this embodiment depicted in FIG. 3, voltage divider/control circuit 204 includes a voltage divider formed of voltage drop elements 301 and 302, which may each comprise, for example, one or more diffused or implanted resistors, transistors connected as load devices, or combinations thereof, thereby serving to divide the voltage appearing on bus 103 so that the entire voltage of bus 103 does not appear across the gate oxide of pass transistor 202. A switch or suitable switching circuitry is provided between a source of VCC and the gate of pass transistor 202. Preferably, capacitor 311 is included between the gate of pass transistor 202 and bus 103, to provide a low impedance path to transient voltages on bus 103, preventing excessive transient voltages on the gate of pass transistor 202.

Figure 4:
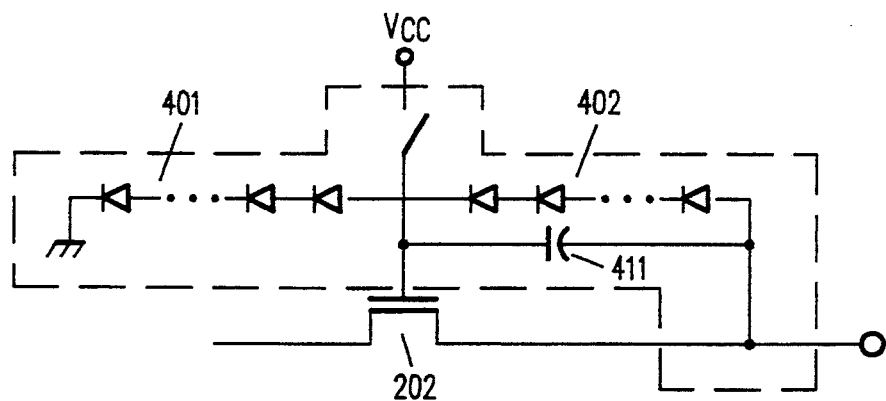
FIG. 4 is a schematic diagram of another embodiment of an interface circuit operating with a pass transistor in accordance with the teachings of this invention.

FIG. 4 is a circuit diagram depicting another embodiment of voltage divider/control circuit 204 together with pass transistor 202. In this embodiment, the voltage divider elements are formed of one or more diodes 401 and 402. It is also to be understood that each voltage divider element 401 and 402 can be formed of any number and combination of voltage drop elements, including diffused or implanted resistors, transistor load devices, diodes, Schottky diodes, zener diodes, and the like. A switch or suitable switching circuitry is provided between a source of VCC and the gate of pass transistor 202. Preferably, capacitor 411 is included between the gate of pass transistor 202 and bus 103, to provide a low impedance path to transient voltages on bus 103, preventing excessive transient voltages on the gate of pass transistor 202.

Figure 5:
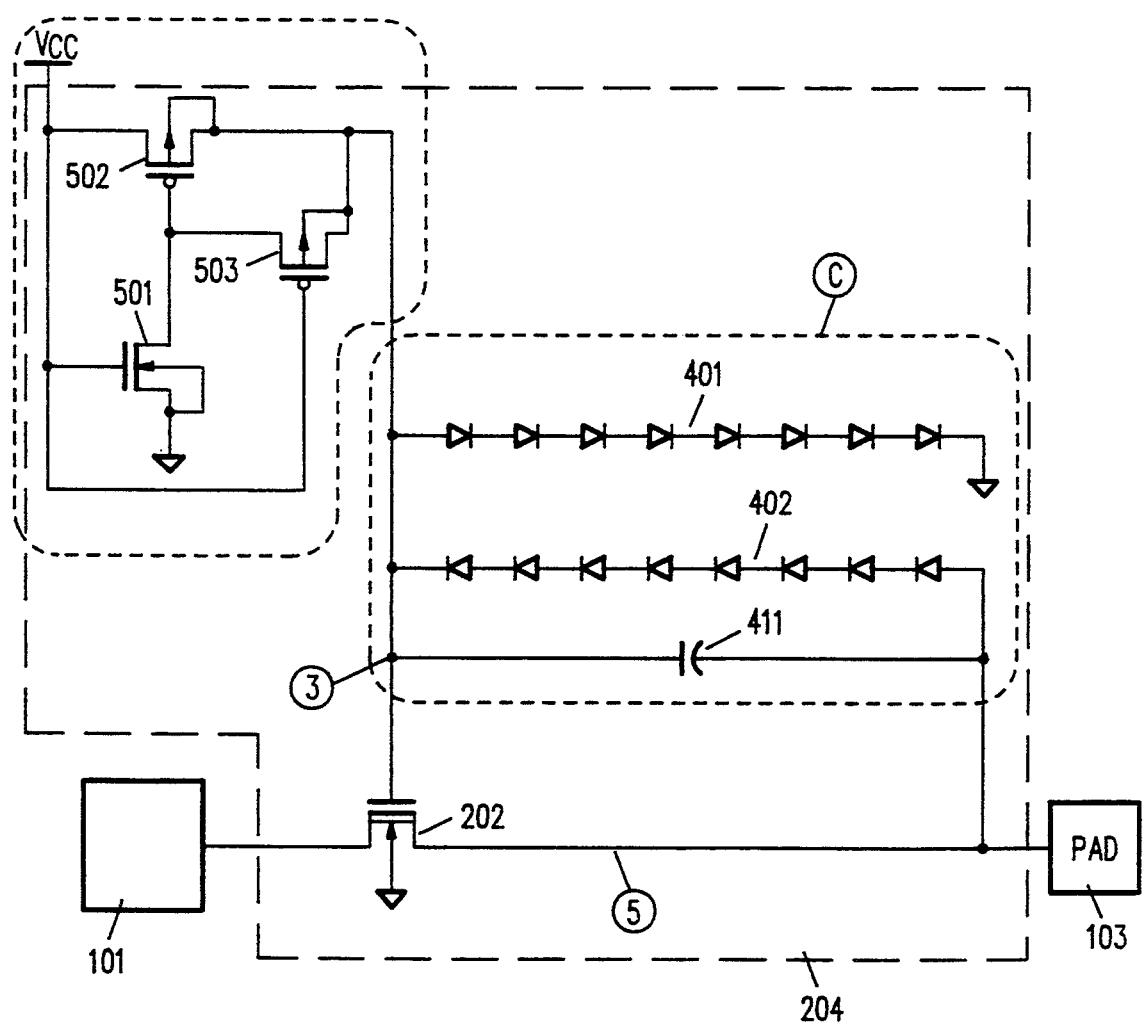
FIG. 5 is a schematic diagram of another embodiment of an interface circuit operating with a pass transistor in accordance with the teachings of this invention.

FIG. 5 is a schematic diagram of another embodiment of the present invention including low voltage circuitry 101, bus connection 103 and voltage divider/control circuitry 204, which in turn includes pass transistor 202 and voltage divider elements 401 and 402 (and capacitor 411, with respect to transient voltages appearing on bus 103). In this embodiment, transistors 501, 502, and 503 are used as a switching circuit to apply as appropriate the VCC voltage from low voltage circuitry 101 to the gate of pass transistor 202. In the embodiment of FIG. 5, transistor 501 is an N-channel enhancement device, transistor 502 is a P-channel enhancement device, and transistor 503 is a P-channel enhancement device. Naturally, other devices could be used, as well as other circuit configurations, to perform the function of transistors 501 through 503, i.e. to apply VCC to the gate of depletion mode P-channel pass transistor 202 when VCC is 3 volts, and to open the current path between VCC and the gate of pass transistor 202 when VCC is zero, in order to prevent current loading of pad 103. The operation of transistors 501 through 503, and pass transistor 202 is depicted in Table 1.

TABLE 1

| VCC | 501 | 502 | 503 | 202 |
| --- | --- | --- | --- | --- |
| 0 | OFF | OFF | ON | DISABLED |
| VCC | ON | ON | OFF | ENABLED |

Figure 6:
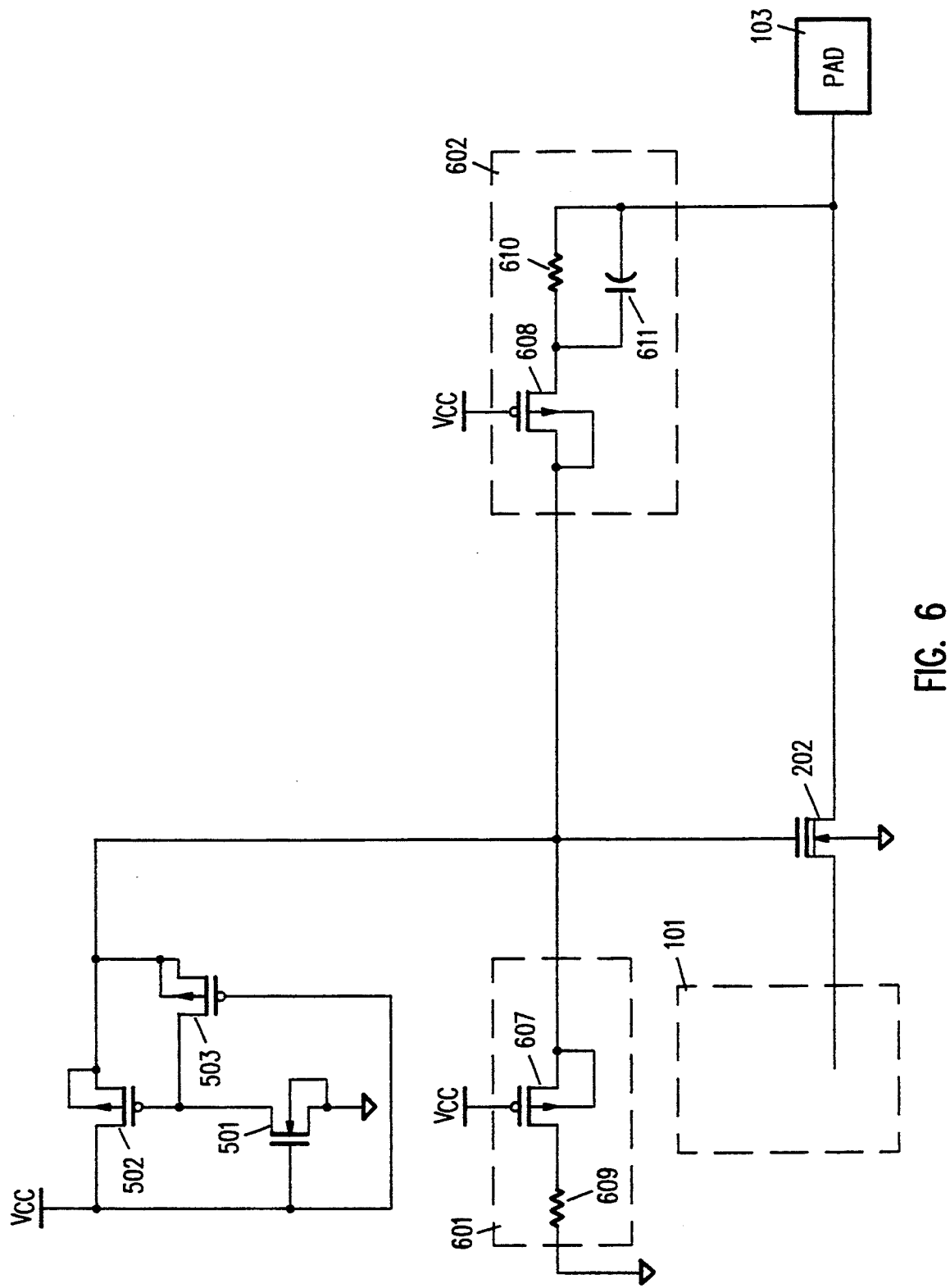
FIG. 6 is a schematic diagram of another embodiment of an interface circuit operating with a pass transistor in accordance with the teachings of this invention.

FIG. 6 is a schematic diagram of an alternative embodiment of this invention, including transistors 501, 502, 503, and 202 as in the embodiment of FIG. 5. Low voltage circuitry 101 can be provided by any suitable output stage, such as are well known in the art. Preferably, however, output stage 101 is provided as an output driver which is specifically designed to be tolerant of overvoltage conditions, such as is disclosed in copending U.S. patent application Ser. No. 08/015,726 filed Feb. 10, 1993 on an invention of Shay entitled "Output Driver". Low voltage circuitry 101 is connected through pass transistor 202 to pad 103, which is in turn connected to other devices or a bus. As shown in the example of FIG. 6, voltage divider elements 601 and 602 include transistors 607 and 608, respectively, which in this example are P-channel enhancement mode devices having gates connected to VCC, one of their source/drain terminals connected to the gate of pass transistor 202, and their other source/drain terminal connected to a resistor element 609, 610.

Naturally, as described above, resistor elements 609 and 610 can be formed of one or more voltage drop devices including diffused or implanted resistors, transistor load devices, diodes, Schottky diodes, zener diodes, and the like. In the embodiment shown in FIG. 6, voltage drop devices 609 and 610 are resistors having a resistance value of approximately 1 megohm each.

Transistors 607 and 608 turn off when VCC is applied, thereby removing the current path through Voltage drop elements 609 and 610 when the circuit is powered up. The use of transistors 607 and 608 reduces the load on pad 103 when VCC is present and thus circuit 101 is powered up, during which time VCC is connected to the gate of pass transistor 202 in order to allow connection between circuit 101 and pad 103. Conversely, since VCC is zero when the low voltage circuit 101 is powered down, transistors 607 and 608 turn on, connecting voltage drop elements 609 and 610, thereby providing an appropriate voltage drop between the voltage appearing on pad 103 and the gate of pass transistor 202, maintaining the voltage across the gate oxide of pass transistor 202 at a safe level, preventing damage to pass transistor 202. While the use of transistors 607 and 608 require some current consumption from pad 103 when VCC equals 0 (powered down load), this current can be kept rather small by appropriate selection of voltage divider elements 609 and 610, while preventing an excessive voltage from appearing across the gate oxide of pass transistor 202 regardless of the voltage appearing on pad 103.

Also, as shown in the example of FIG. 6, in one embodiment capacitor 611 is coupled in parallel with voltage drop device 610, which serves to allow fast response during rapid voltage transients on pad 103, again preventing the voltage across the gate oxide of pass transistor 202 from exceeding a safe limit. In one embodiment, the value of capacitor 611 is approximately equal to the gate capacitance of pass transistor 202.

In an alternative embodiment, each voltage drop element 609 and 610 is formed of eight Schottky diodes connected in series, each Schottky diode having a forward voltage drop of about 0.5 volts, thereby causing each voltage drop element 609 and 610 to have a total drop of about 4 volts. If the voltage on pad 103 is 7 volts, as is experienced in TTL systems during transient voltages, the gate voltage on pass transistor 202 is approximately 3 volts, and the gate to drain voltage across the gate oxide of pass transistor 202 is about 4 volts. When the voltage on pad 103 is about 5.5 volts, a maximum TTL level, the voltage on the gate of pass transistor 202 is approximately 4 volts, and the gate to drain voltage across the gate oxide of pass transistor 202 is approximately 1.5 volts. Given a typical safe gate oxide voltage of approximately 4.6 volts in a 3 volt process, this embodiment ensures the safe gate oxide voltage of pass transistor 202 is not exceeded during normal operating conditions of a TTL circuit connected to pad 103, even given a typical transient TTL voltage of up to 7 volts. Voltage drop device 609 to ground serves as a leakage path to prevent leakage current from voltage drop device 610 from charging the gate of pass transistor 202 to a voltage exceeding 4.6 volts.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. An interface circuit for connection between a first circuit designed for operation when powered up by a first supply voltage level and a lead operating at a second voltage level greater than said first supply voltage, comprising:
   a first lead coupled to said first circuit;
   a second lead coupled to said lead operating at said second voltage level;
   a third lead coupled to receive said first supply voltage;
   a pass device coupled between said first and second leads of said interface circuit and controlled by said first supply voltage; and
   a voltage limiting circuit coupled between said second lead of said interface circuit and a control terminal of said pass device.

2. An interface circuit as in claim 1 wherein said pass device comprises a pass transistor.

3. An interface circuit as in claim 2 wherein said pass transistor comprises a first current handling lead coupled to said first lead of said interface circuit, a second current handling lead coupled to said second lead of said interface circuit, and a control terminal coupled to receive said first supply voltage.

4. An interface circuit as in claim 3 which further comprises a switch circuit for selectively opening the connection between said control terminal of said pass transistor and said first supply voltage.

5. An interface circuit as in claim 4 wherein said switch circuit serves to selectively open the connection between said control terminal of said pass transistor and said first supply voltage when said first supply voltage is disabled.

6. An interface circuit as in claim 1 wherein said voltage limiting circuit comprises a voltage divider.

7. An interface circuit as in claim 6 wherein said voltage divider comprises a first branch coupled between said second lead of said interface circuit and said control terminal of said pass transistor, and a second branch coupled between said control terminal of said pass transistor and a voltage source.

8. An interface circuit as in claim 7 wherein said voltage source is ground.

9. An interface circuit as in claim 7 wherein one or both branches of said voltage divider comprise one or more resistors, diodes, Shottkey diodes, Zener diodes, or transistor load devices.

10. An interface circuit as in claim 9 wherein said first branch further comprises a capacitor coupled between said second lead of said interface circuit and said control terminal of said pass transistor.

11. An interface circuit as in claim 10 wherein said capacitor has a capacitance approximately equal to the capacitance of said control terminal of said pass transistor.

12. An interface circuit for connection between a first, powered down circuit and an active bus, comprising:
   a first lead coupled to receive a first supply voltage applied to said powered down circuit;
   a first lead coupled to said first circuit;
   a second lead coupled to said bus;
   a pass device coupled between said first and second leads of said interface circuit and controlled by said first supply voltage; and a voltage limiting circuit coupled between said second lead of said interface circuit and a control terminal of said pass device.

13. An interface circuit as in claim 12 wherein said pass device comprises a pass transistor.

14. An interface circuit as in claim 13 wherein said pass transistor comprises a first current handling lead coupled to said first lead of said interface circuit, a second current handling lead coupled to said second lead of said interface circuit, and a control terminal coupled to receive said first supply voltage.

15. An interface circuit as in claim 14 which further comprises a switch circuit for selectively opening the connection between said control terminal of said pass transistor and said first supply voltage.

16. An interface circuit as in claim 15 wherein said switch circuit serves to selectively open the connection between said control terminal of said pass transistor and said first supply voltage when said first supply voltage is disabled.

17. An interface circuit as in claim 12 wherein said voltage limiting circuit comprises a voltage divider.

18. An interface circuit as in claim 17 wherein said voltage divider comprises a first branch coupled between said second lead of said interface circuit and said control terminal of said pass transistor, and a second branch coupled between said control terminal of said pass transistor and a voltage source.

19. An interface circuit as in claim 18 wherein said voltage source is ground.

20. An interface circuit as in claim 18 wherein one or both branches of said voltage divider comprise one or more resistors, diodes, Shottkey diodes, Zener diodes, or transistor load devices, 21. An interface circuit as in claim 20 wherein said first branch further comprises a capacitor coupled between said second lead of said interface circuit and said control terminal of said pass transistor.

22. An interface circuit as in claim 21 wherein said capacitor has a capacitance approximately equal to the capacitance of said control terminal of said pass transistor.

23. A method for operating an interface circuit for connection between a first circuit designed for operation at a first supply voltage level and a lead operating at a second voltage level greater than said first supply voltage, comprising the steps of:
coupling a first lead of said interface circuit to said first circuit;
coupling a second lead of said interface circuit to said lead operating at said second voltage level;
coupling a pass device between said first and second leads of said interface circuit;
controlling said pass device by a first supply voltage applied to said first circuit; and
limiting the voltage between said second lead of said interface circuit and a control terminal of said pass device.

24. A method as in claim 23 wherein said step of coupling a pass device comprises the step of coupling a pass transistor.

25. A method as in claim 24 wherein said step of controlling said pass transistor comprises the step of coupling said first supply voltage to a control terminal of said pass transistor.

26. A method as in claim 25 wherein said step of controlling further comprises the step of removing said first supply voltage from said control terminal of said pass transistor when said first supply voltage is disabled.

27. A method as in claim 23 wherein said step of limiting comprises the step of dividing the voltage on said second lead of said interface circuit for coupling to said control terminal of said pass transistor.

28. A method as in claim 27 wherein said step of dividing comprises the step of dividing utilizing one or more resistors, diodes, Shottkey diodes, Zener diodes, or transistor load devices.

29. A method as in claim 27 wherein said step of dividing further comprises providing transient coupling between said second lead of said interface circuit and said control terminal of said pass transistor.

30. An electronic system comprising:
a first, powered down circuit;
an active bus; and
an interface circuit connected between said first circuit and said bus, said interface circuit comprising:
a first lead coupled to receive a first supply voltage applied to said powered down circuit;
a first lead coupled to said first circuit;
a second lead coupled to said bus;
a pass device coupled between said first and second leads of said interface circuit and controlled by said first supply voltage; and
a voltage limiting circuit coupled between said second lead of said interface circuit and a control terminal of said pass device.

31. A system as in claim 30 wherein said pass device comprises a pass transistor.

32. A system as in claim 31 wherein said pass transistor comprises a first current handling lead coupled to said first lead of said interface circuit, a second current handling lead coupled to said second lead of said interface circuit, and a control terminal coupled to receive said first supply voltage.

33. A system as in claim 32 which further comprises a switch circuit for selectively opening the connection between said control terminal of said pass transistor and said first supply voltage.

34. A system as in claim 33 wherein said switch circuit serves to selectively open the connection between said control terminal of said pass transistor and said first supply voltage when said first supply voltage is disabled.

35. A system as in claim 30 wherein said voltage limiting circuit comprises a voltage divider.

36. A system as in claim 35 wherein said voltage divider comprises a first branch coupled between said second lead of said interface circuit and said control terminal of said pass transistor, and a second branch coupled between said control terminal of said pass transistor and a voltage source.

37. A system as in claim 36 wherein said voltage source is ground.

38. A system as in claim 36 wherein one or both branches of said voltage divider comprise one or more resistors, diodes, Shottkey diodes, Zener diodes, or transistor load devices.

39. A system as in claim 38 wherein said first branch further comprises a capacitor coupled between said second lead of said interface circuit and said control terminal of said pass transistor.

40. A system as in claim 39 wherein said capacitor has a capacitance approximately equal to the capacitance of said control terminal of said pass transistor.

41. A method for operating an electronic system including a first circuit designed for operation at a first supply voltage level, a second circuit, and an interface circuit for connection between said first and second circuits operating at a second voltage level greater than said first supply voltage, comprising the steps of:
  coupling a first lead of said interface circuit to said first circuit;
  coupling a second lead of said interface circuit to said second circuit;
  coupling a pass device between said first and second leads of said interface circuit;
  controlling said pass device by a first supply voltage applied to said first circuit; and
  limiting the voltage between said second lead of said interface circuit and a control terminal of said pass device.

42. A method as in claim 41 wherein said step of coupling a pass device comprises the step of coupling a pass transistor.

43. A method as in claim 42 wherein said step of controlling said pass transistor comprises the step of coupling said first supply voltage to a control terminal of said pass transistor.

44. A method as in claim 43 wherein said step of controlling further comprises the step of removing said first supply voltage from said control terminal of said pass transistor when said first supply voltage is disabled.

45. A method as in claim 41 wherein said step of limiting comprises the step of dividing the voltage on said second lead of said interface circuit for coupling to said control terminal of said pass transistor.

46. A method as in claim 45 wherein said step of dividing comprises the step of dividing utilizing one or more resistors, diodes, Shottkey diodes, Zener diodes, or transistor load devices.

47. A method as in claim 45 wherein said step of dividing further comprises providing transient coupling between said second lead of said interface circuit and said control terminal of said pass transistor.

* * * * *

UNITED STATES PATENT AND TRADEMARK OFFICE
CERTIFICATE OF CORRECTION

PATENT NO. : 5,397,941

DATED : March 14, 1995

INVENTOR(S) : Richard Merrill

It is certified that error appears in the above-identified patent and that said Letters Patent are hereby corrected as shown below: On the title page, item [75]:

Correct the Inventor by Replacing: "Richard Merrill, 258 Alta Vista Way, Daly City, California, 94014" with --Richard Merrill, 258 Alta Vista Way, Daly City, California, 94014, Michael Shay, 2021 Thames Drive, Arlington, Texas, 76017 and Enayet U Issaq, 885 Mulcaster Court, San Jose, California, 95136--

Signed and Sealed this

Seventeenth Day of December, 1996

Attest:

BRUCE LEHMAN

Attesting Officer

Commissioner of Patents and Trademarks